US005644476A

United States Patent [19]
Weekamp et al.

[11] Patent Number: 5,644,476
[45] Date of Patent: Jul. 1, 1997

[54] FLEXIBLE FASTENING MEMBER AND OBJECT PROVIDED WITH SUCH A FASTENING MEMBER, AND SUPPORT PROVIDED WITH BOTH

[75] Inventors: Johannus W. Weekamp, Eindhoven; Johannes Brandsma, Roermond, both of Netherlands

[73] Assignee: U.S. Philips Corporation, New York, N.Y.

[21] Appl. No.: 323,525

[22] Filed: Oct. 13, 1994

[30] Foreign Application Priority Data

Oct. 13, 1993 [BE] Belgium ............................. 9301079

[51] Int. Cl.$^6$ ........................................ H05K 1/14
[52] U.S. Cl. ................. 361/773; 361/772; 439/68; 439/83; 257/692; 257/690; 257/734; 257/735; 29/854; 29/882
[58] Field of Search ...................... 361/773, 760, 361/772, 776; 174/260, 261; 439/78, 83, 74, 65, 68; 257/693, 690, 692, 696, 694, 735, 734; 29/854, 874, 882, 884

[56] References Cited

U.S. PATENT DOCUMENTS

| | | |
|---|---|---|
| 2,898,519 | 11/1959 | Foster ........................................ 317/101 |
| 3,857,349 | 12/1974 | Pritulsky ..................................... 113/119 |
| 4,471,408 | 9/1984 | Martinez ..................................... 361/392 |
| 4,647,126 | 3/1987 | Sobota, Jr. ................................. 339/17 CF |
| 5,018,005 | 5/1991 | Lin et al. ..................................... 357/80 |
| 5,117,330 | 5/1992 | Miazga ........................................ 361/400 |
| 5,353,621 | 10/1994 | Knecht et al. ............................. 72/379.2 |

*Primary Examiner*—Laura Thomas
*Attorney, Agent, or Firm*—Steven R. Biren

[57] ABSTRACT

The invention relates to a method of manufacturing a flexible fastening member (19) comprising a foil (1) for fastening an object (15) thereto, characterized by making at least two generally U-shaped incisions (5) which are spaced apart, which define a central portion (23) between them, and which are directed oppositely to another, the open ends of the U-shapes facing away from another so as to create two mutually opposed tags (11), and by bending the foil (1) along two parallel bending lines (13), each line being situated at the open end of a U-shaped incision (5) so as to obtain a generally U-shaped member (19) whose base is said central portion (23), and to obtain the tags (11) as extensions of the legs (25) of said U-shaped member and situated at one side of the plane (20) defined by the central portion (23), the legs (25) being situated at the other side of said plane (20). The invention also relates to a fastening member obtained by the method, an object provided with such a fastening member, a support provided with an object and such a fastening member, and a packaging provided with a number of such fastening members.

22 Claims, 4 Drawing Sheets

FLEXIBLE FASTENING MEMBER AND OBJECT PROVIDED WITH SUCH A FASTENING MEMBER, AND SUPPORT PROVIDED WITH BOTH

FIELD OF THE INVENTION

The invention relates to a method of manufacturing a flexible fastening member comprising a foil for fastening an object thereto.

The invention also relates to a flexible fastening member for fastening an object thereto, an object provided with such a fastening member, a support provided with an object and such a fastening member, and a packaging provided with a number of such fastening members.

BACKGROUND OF THE INVENTION

U.S. Pat. No. 4,647,126 discloses a flexible fastening member of the kind mentioned in the opening paragraph which is fastened at one side to a component or object and at another side to a printed circuit board or support. If the component is fastened directly to the printed circuit board, mechanical stresses may arise in the component, the printed circuit board, and the connection between component and printed circuit board owing to differences in coefficient of thermal expansion between the component and the printed circuit board. Such stresses also arise upon bending of the printed circuit board. The stresses may cause the connection, the component, or the printed circuit board to break. The flexible fastening member absorbs the stresses and ensures that forces exerted on the printed circuit board are not transmitted to the component.

The flexible fastening member is manufactured from a metal foil of which only a portion is used. The remainder of the foil metal is scrap material. Furthermore, at least two fastening members are required for each component.

SUMMARY OF THE INVENTION

The invention has for its object to provide a method of manufacturing a flexible fastening member for which the entire foil is used to avoid waste of material and with which a fastening member is obtained for easy fastening of an object thereto.

To this end the method of manufacturing a flexible fastening member is characterized by making at least two generally U-shaped incisions which are spaced apart, which define a central portion between them, and which are directed oppositely to one another, the open ends of the U-shapes facing away from one another so as to create two mutually opposed tags, and bending the foil along two parallel bending lines, each line being situated at the open end of a U-shaped incision so as to obtain a generally U-shaped member, whose base is the central portion, and to obtain the tags as extensions of the legs of the U-shaped member and being situated at one side of the plane defined by the central portion, the legs being situated at the other side of the plane.

The term "generally U-shaped incision" is understood to mean also incisions such as, for example, V-shaped or C-shaped incisions. Scrap material is avoided by this method. An object may be easily clamped between the two tags owing to bending stresses in the bent foil. The tags may be fastened to the object by means of glue or solder.

A further method of the invention is characterized in that the tags are bent at their ends through substantially 90° in the direction of the central portion. An object may then be enclosed on four sides by the fastening member thus created, so that a good connection between the object and the fastening member is obtained. The object lies with one side against the central portion, is clamped in by the tags at two sides, and is held at a side of the object remote from the central portion by the hooked ends of the tags.

A further method of the invention is characterized in that end portions of the legs remote from the tags are connected to a support. This can be done by means of glue or solder. Bending of the end portions of the legs about lines directed parallel to the parallel lines provides a good contact between the flexible fastening member and the support.

The invention also relates to a flexible fastening member comprising a foil for fastening an object thereto which member is generally U-shaped with a central portion as the base of the U, the legs being bent along parallel bending lines, the member having tags forming extensions of the legs of the U-shaped member and being an integral part of the legs, the tags being situated at one side of the plane defined by the central portion and the legs at the other side of the plane.

An object may be easily clamped between the two tags and fastened thereto by means of glue or solder. Only one fastening member is required for each object.

A further embodiment of the flexible fastening member according to the invention is characterized in that the member is made of electrically insulating material and that at least the tags and the legs are provided with electrically conducting tracks.

A stress-free connection between an object and a support may be obtained by means of the fastening member, which at the same time forms an electrical connection between the object and the support. The conductive tracks may be provided in or on the foil.

A further embodiment of the flexible fastening member described above is characterized in that the conductive tracks are present in parallel arrangement transverse to the parallel bending lines.

The foil to be used may be manufactured in a comparatively simple and inexpensive manner in that the conductive parallel tracks are provided, for example, over the entire foil.

A yet further embodiment of the flexible fastening member according to the invention is characterized in that the tags are provided with end portions which are bent through substantially 90° in the direction of the central portion.

An object may then be enclosed on four sides by the fastening member thus created, so that a good connection between the object and fastening member is obtained. The object then lies with one side against the central portion, is clamped in by the tags at two sides, and is held at a side of the object remote from the central portion by the hooked ends of the tags.

A still further embodiment of the flexible fastening member according to the invention is characterized in that the legs are provided with end portions which are bent about lines directed parallel to the parallel lines.

A good contact between the flexible fastening member and the support is obtained thereby.

The invention also relates to an object provided with a flexible fastening member according to the invention, such that the object is supported by the central portion and by the tags.

An embodiment of the object according to the invention is characterized in that the object is electrically connected to the conducting tracks.

Electrical connections of the object may thus be connected to the conducting tracks of the flexible fastening member.

The invention further relates to a support provided with a flexible fastening member and an object. The support according to the invention is characterized in that the object is situated at the one side of the plane defined by the central portion, while the support is situated at the other side of the plane and is connected to the end portions of the legs.

An embodiment of the support according to the invention is characterized in that the support and the object are electrically connected to the conducting tracks.

Electrical connections of the support are thus connected to the conducting tracks of the flexible fastening member and to electrical connections of the object.

The flexible fastening member may alternatively be used as a packaging for the object. The packaging according to the invention is for this purpose characterized in that a number of the fastening members are interconnected by means of the end portions of the legs.

BRIEF DESCRIPTION OF THE DRAWING

The invention will be explained in more detail with reference to the drawing, in which.

Corresponding components have been given the same reference numerals in the various Figures.

DESCRIPTION OF THE PREFERRED EMBODIMENTS

Figure 1:
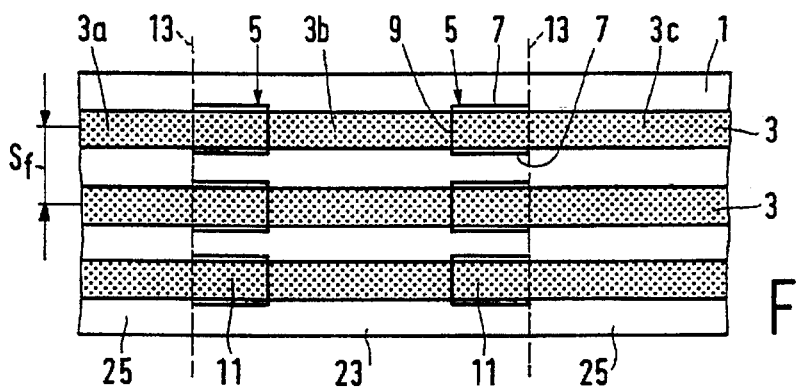
FIG. 1 is a diagrammatic plan view of a foil.

FIG. 1 shows a foil 1 made of polyimide and provided with a number of parallel electrically conducting tracks 3 formed from tinned copper. The method of manufacturing the fastening member is as follows:

pairs of U-shaped incisions 5 are made in the foil 1 and the conducting tracks 3 by means of a cutting tool (not shown). The two incisions of one pair of incisions are directed oppositely to another, the open ends of the U-shapes being remote from another, the legs 7 of each U-shaped incision being directed parallel to the parallel tracks 3, while a bridge 9 interconnecting the legs 7 runs transversely to the parallel tracks 3. Each track 3 is divided into three track portions 3a, 3b and 3c by making the U-shaped incisions. The portion of the member surrounded by a U-shaped incision 5 forms a tag 11 having a track portion which forms a part of the outer track portion 3a or 3c.

after the incisions 5 have been made in the foil 1, the foil is bent about two parallel lines 13 (see also FIG. 3), each line being situated at the open end of the U-shaped incision, whereby the foil 1 is plastically deformed. The lines 13 run transversely to the tracks 3. In this way the fastening member 19, see FIG. 3, obtains a substantially a U-shape. The base thereof is the central portion 23 containing the central track portion 3b, the legs thereof are the outer portions 25 containing the outer track portions 3a and 3c. The tags 11 are extentions of the outer portions 25.

Figure 2:
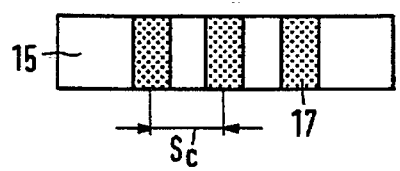
FIG. 2 shows an object to be fastened on a support.

FIG. 2 shows an electrical component or object 15 provided with connection surfaces 17. The pitch Sc between the connection surfaces 17 corresponds to the pitch Sf between the tracks 3 (FIG. 1).

Figure 3:
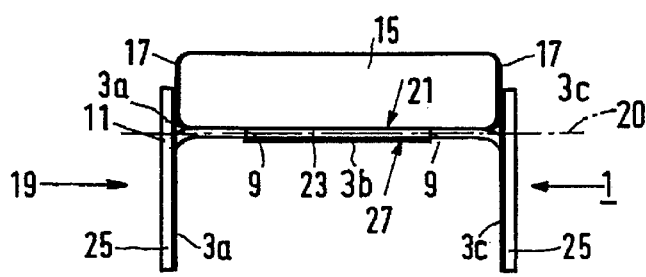
FIG. 3 is a side elevation of an object with a flexible fastening member according to the invention.

FIG. 3 shows a flexible fastening member 19 formed from the bent foil 1. The tags 11 are situated at one side 21 of the plane (20) in which the central portion 23 is disposed, while the legs or outer portions 25 are situated at the other side 27 of said plane (20). The object, a component 15 is put between the tags 11, such that the connection surfaces 17 contact the tracks 3.

Figure 4:
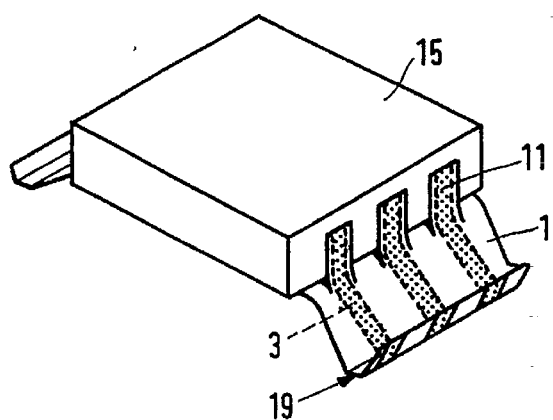
FIG. 4 is another elevation of the object shown in FIG. 3, with a flexible fastening member according to the invention.

FIG. 4 shows the flexible fastening member 19 shown in FIG. 3 with the component 15 fastened therein, the tags 11 being fastened to the connection surfaces 17 by means of soldering.

Figure 5:
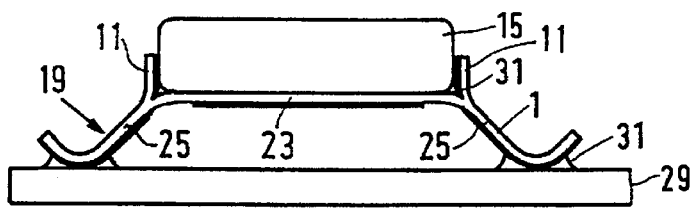
FIG. 5 shows an object which is fastened to a support by means of a flexible fastening member.

FIG. 5 shows a component 15 and a printed circuit board 29 which are electrically and mechanically connected to one another by means of the flexible fastening member 19. The conducting tracks 3 of the flexible fastening member 19 are connected to the component 15 and to track patterns (not shown) on the printed circuit board 29 by means of solder 31.

Figure 6:
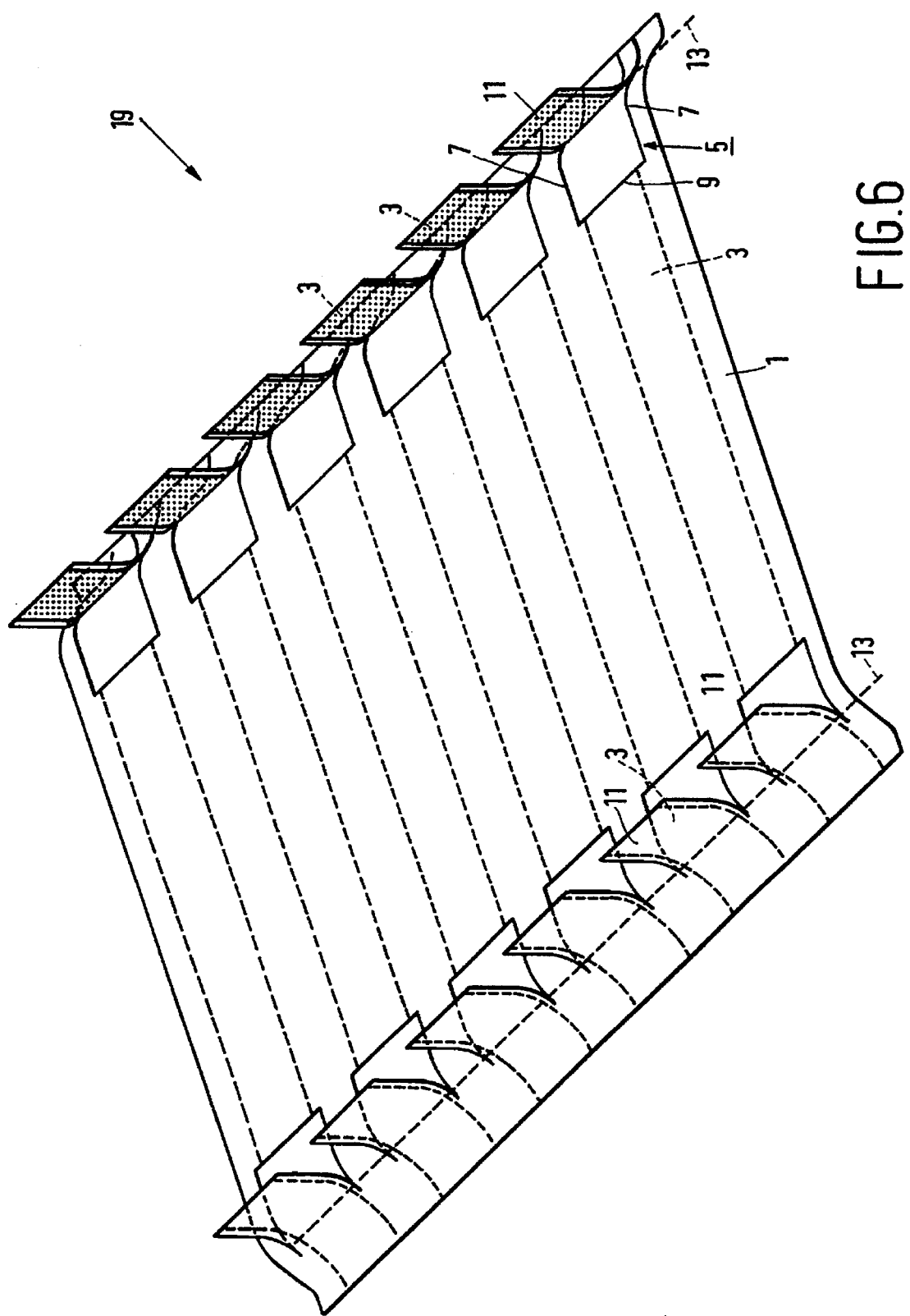
FIG. 6 shows the flexible fastening member according to the invention also shown in FIG. 3.

FIG. 6 shows the flexible fastening member 19 provided with the foil 1 and the conducting tracks 3 provided thereon, in which foil incisions 5 are provided such that tags 11 are formed upon bending of the foil 1 about the line 13. Mutually opposed tags 11 are provided with the conducting tracks 3 at the sides which face one another.

Figure 7:
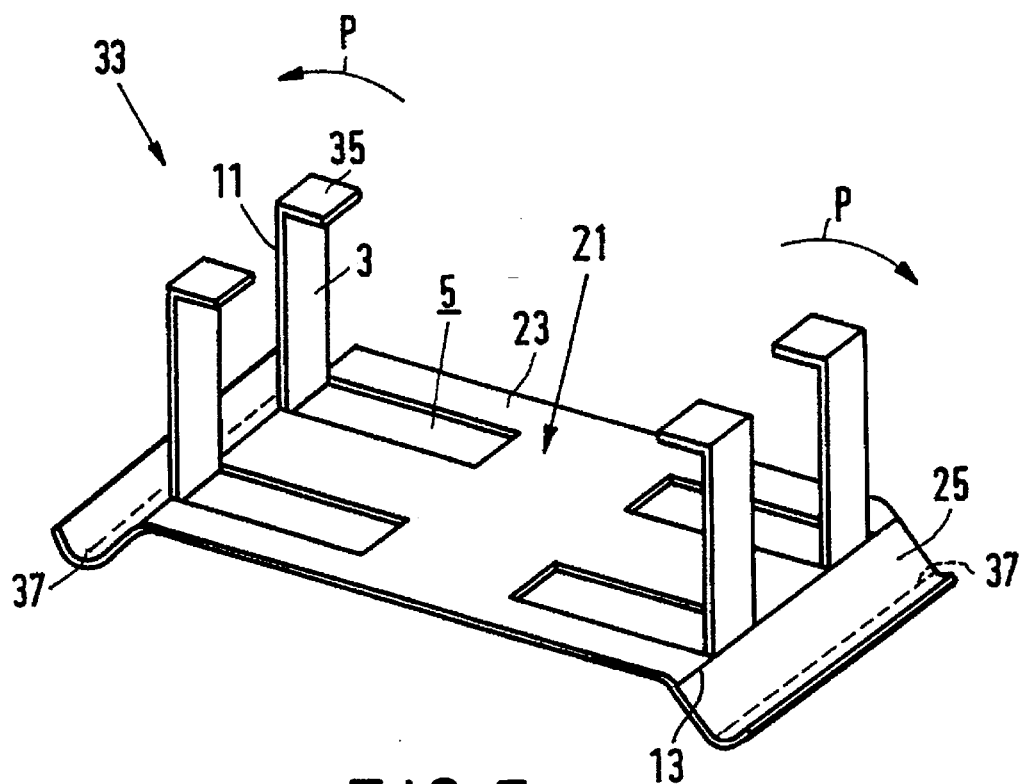
FIG. 7 shows an alternative embodiment of a flexible fastening member according to the invention.

FIG. 7 shows another flexible fastening member 33 according to the invention in which the vertical tags 11 have been hooked at their ends 35 in the direction of the central portion 23. The legs or outer portions 25 have been bent at lines 37 which run parallel to the lines 13, whereby gutter-type portions 25 are formed.

Figure 8:
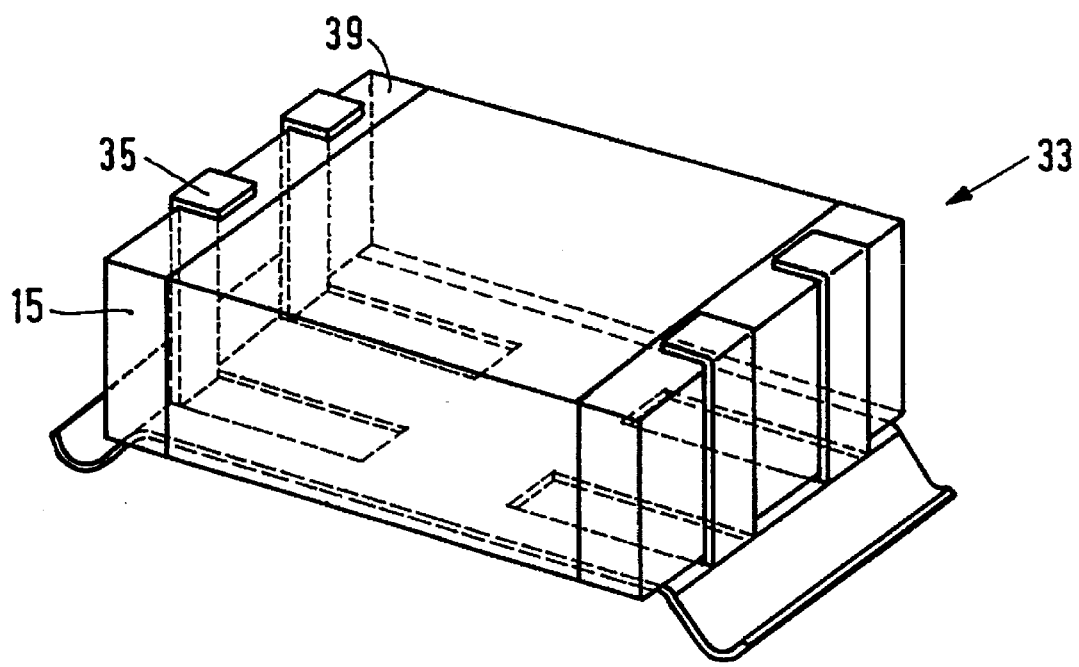
FIG. 8 shows an object with the flexible fastening member shown in FIG. 7.

FIG. 8 shows the flexible fastening member 33 shown in FIG. 7, with the fastening member 33 connected to a component 15 and the ends 35 of the tags 11 connected to an upper side 39 of the component 15. For fastening the component 15 in the flexible fastening member 33, the tags 11 are bent in a direction P indicated in FIG. 7 against the resilient pressure of the foil, then the component is laid on the upper side 21 of the central portion 23, after which the tags 11 bend in a direction opposite to the direction P owing to the resiliency of the foil and the electrically conducting tracks 3 present thereon, and the component 15 is clamped in between the tags 11.

Figure 9:
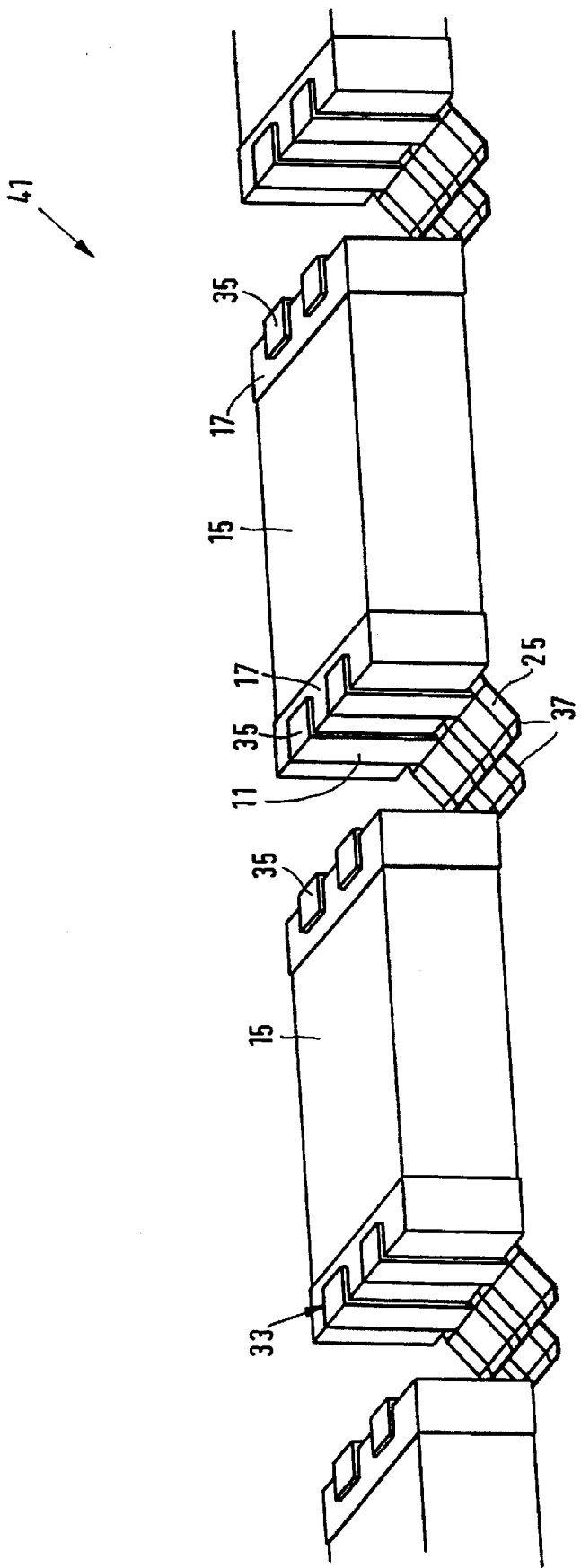
FIG. 9 shows packaging according to the invention.

FIG. 9 shows a packaging 41 according to the invention in which the legs or outer portions 25 of several fastening members 33 are interconnected. The packaging 41 is manufactured from a long strip of foil in which U-shaped incisions are provided. Then the tags 11 with the hooked ends 35 and the edge portions 25 are formed through plastic deformation of the foil. Subsequently the components 15 are placed between the tags 11 and connected to the tags 11. The packaging chain of flexible fastening members 33 with the components 15 present therein may be wound on a reel or be folded in a meander shape. For placing the flexible fastening member 33 with the component 15 fastened therein on a printed circuit board, the outer portions 25 of the fastening member 33 are severed from the remainder of the packaging 41.

Instead of polyimide foil, foils made from polyester, polyamide, or polyethylene terephthalate (PETP) may alternatively be used.

The flexible fastening member may be used for fastening an electrical component on a printed circuit board but also, for example, for fastening a glass plate in a housing, or generally, for connecting an object to a support wherever mechanical stresses in the connections are to be avoided.

We claim:

1. A method of manufacturing a flexible fastening member comprising a foil for fastening an object thereto, characterized by making at least two generally U-shaped incisions which are spaced apart, which define a central portion between them, and which are directed oppositely to one another, the open ends of the U-shapes facing away from one another so as to create two mutually opposed tags; and bending the foil along two parallel bending lines, each line being situated at the open end of a U-shaped incision so as to obtain a generally U-shaped member whose base is said central portion, and to obtain the tags as extensions of the legs of said U-shaped member and situated at one side of the plane defined by the central portion, the legs being situated at the other side of said plane and end portions of the legs remote from the tags being connected to a support.

2. A method as claimed in claim 1, characterized in that the tags are bent at their ends through substantially 90° in the direction of the central portion.

3. A method as claimed in claim 2 wherein end portions of the legs remote from the tags are connected to a support.

4. A method as claimed in claim 1, characterized in that the end portions of the legs are bent about lines directed parallel to said parallel lines.

5. A flexible fastening member comprising a foil for fastening an object thereto, characterized in that the member is generally U-shaped with a central portion as the base of the U, the legs being bent along parallel bending lines, said member having tags forming extensions of the legs of said U-shaped member and being an integral part of the legs, the tags being situated at one side of the plane defined by the central portion and the legs at the other side of said plane, and in that the member is made of electrically insulating material and at least the tags and the legs are provided with electrically conducting tracks.

6. A flexible fastening member as claimed in claim 5, characterized in that the conducting tracks are present in parallel arrangement transverse to the parallel bending lines.

7. A flexible fastening member as claimed in claim 6 wherein the tags are provided with end portions which are bent through substantially 90° in the direction of the central portion.

8. A flexible fastening member as claimed in claim 6 wherein the legs are provided with end portions which are bent about lines directed parallel to said parallel lines.

9. An object provided with a flexible fastening member as claimed in claim 6 wherein the object is supported by said central portion and by said tags.

10. A flexible fastening member as claimed claim 5, characterized in that the tags are provided with end portions which are bent through substantially 90° in the direction of the central portion.

11. A flexible fastening member as claimed in claim 10 wherein the legs are provided with end portions which are bent about lines directed parallel to said parallel lines.

12. An object provided with a flexible fastening member as claimed in claim 10 wherein the object is supported by said central portion and by said tags.

13. A flexible fastening member as claimed in claim 5, characterized in that the legs are provided with end portions which are bent about lines directed parallel to said parallel lines.

14. An object provided with a flexible fastening member as claimed in claim 13 wherein the object is supported by said central portion and by said tags.

15. An object provided with a flexible fastening member as claimed in claim 5 wherein the object is supported by said central portion and by said tags.

16. A flexible fastening member as claimed in claim 5 wherein the tags are provided with end portions which are bent through substantially 90° in the direction of the central portion.

17. A packaging provided with a number of flexible fastening members each comprising a foil for fastening an object thereto, characterized in that the member is generally U-shaped with a central portion as the base of the U, the legs being bent along parallel bending lines, said member having tags forming extensions of the legs of said U-shaped member and being an integral part of the legs, the tags being situated at one side of the plane defined by the central portion and the legs at the other side of said plane, and in that the members are interconnected by means of the end portions of the legs.

18. An object provided with a flexible fastening member comprising a foil for fastening an object thereto, characterized in that the member is generally U-shaped with a central portion as the base of the U, the legs being bent along parallel bending lines, said member having tags forming extensions of the legs of said U-shaped member and being an integral part of the legs, the tags being situated at one side of the plane defined by the central portion and the legs at the other side of said plane, and in that the object is supported by said central portion and by said tags.

19. A support provided with a flexible fastening member and an object as claimed in claim 18, characterized in that the object is situated at said one side of the plane defined by the central portion, while the support is situated at said other side of said plane and is connected to end portions of the legs remote from the tags.

20. A support as claimed in claim 19, characterized in that at least the tags and the legs are provided with electrically conducting tracks and the support and the object are electrically connected to the conducting tracks.

21. An object provided with a flexible fastening member comprising a foil for fastening an object thereto, characterized in that the member is generally U-shaped with a central portion as the base of the U, the legs being bent along parallel bending lines, said member having tags forming extensions of the legs of said U-shaped member and being an integral part of the legs, the tags being situated at one side of the plane defined by the central portion and the legs at the other side of said plane, and in that at least the tags and the legs are provided with electrically conducting tracks and the object is electrically connected to the conducting tracks.

22. A support provided with a flexible fastening member and an object as claimed in claim 21 wherein the object is situated at said one side of the plane defined by the central portion, while the support is situated at said other side of said plane and is connected to end portions of the legs remote from the tags.

* * * * *